United States Patent
Konishi

(10) Patent No.: US 6,476,495 B2
(45) Date of Patent: Nov. 5, 2002

(54) TRANSISTOR WHICH CAN MINIMIZE THE DC RESISTANCE OF THE WIRING AND LEAD FORMED ON A SEMICONDUCTOR CHIP

(75) Inventor: Takahiko Konishi, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 10/026,529

(22) Filed: Dec. 27, 2001

(65) Prior Publication Data

US 2002/0084511 A1 Jul. 4, 2002

(30) Foreign Application Priority Data

Dec. 28, 2000 (JP) .......................................... 2000-402907

(51) Int. Cl.[7] .......................... H01L 23/48; H01L 23/52; H01L 29/40

(52) U.S. Cl. ..................... 257/773; 257/341; 257/578; 257/579; 257/584; 257/654; 257/786

(58) Field of Search ................................. 257/341, 578, 257/579, 584, 654, 773, 786

(56) References Cited

U.S. PATENT DOCUMENTS

| | | | | |
|---|---|---|---|---|
| 4,994,880 A | * | 2/1991 | Kato et al. | |
| 5,414,296 A | * | 5/1995 | Bartlow | ........................ 257/579 |
| 5,539,243 A | * | 7/1996 | Matsuki | ........................ 257/584 |
| 6,046,493 A | * | 4/2000 | Dekker et al. | ............... 257/579 |
| 6,236,092 B1 | * | 5/2001 | Chen et al. | ................... 257/401 |

\* cited by examiner

Primary Examiner—Nân V. Ngô
(74) Attorney, Agent, or Firm—Morgan, Lewis & Bockius LLP

(57) ABSTRACT

A semiconductor chip 10 is provided to form a large number of cells constituting transistor units arranged on a planar and rectangular semiconductor substrate. On the front surface of the semiconductor chip 10, an emitter electrode 1 to be connected to an emitter and a base electrode 2 to be connected to an base are formed and electrode pads 1a and 2a of the emitter electrode 1 and the base electrode 2 are formed on opposite long sides of the rectangular substrate. On the rear surface of the semiconductor chip 10, a collector electrode 3 to be connected to a collector is formed. The semiconductor chip 10 is bonded to a rectangular island 6a at the tip of a third lead 6. A first lead 4 and a second lead 5 are directly connected to the emitter electrode pad 1a and base electrode pad 2a, respectively.

8 Claims, 3 Drawing Sheets

TRANSISTOR WHICH CAN MINIMIZE THE DC RESISTANCE OF THE WIRING AND LEAD FORMED ON A SEMICONDUCTOR CHIP

BACKGROUND OF THE INVENTION

1. Field of the Invention

This invention relates to a semiconductor device used for a transistor such as a bipolar transistor, MOS transistor, IGBT, etc., and more particularly to a transistor which can minimize the DC resistance of the wiring and lead formed on a semiconductor chip, thereby giving a large current at a low voltage.

2. Description of the Related Art

The bipolar transistor provides a corrector current which depends on the area and circumferential length of an emitter. Therefore, in order to acquire a large current, emitter regions are preferably distributed in a base region. For this purpose, a large number of cells constituting transistor units are distributed in a "stripe emitter structure", "multi-emitter structure" or "multi-base structure". An emitter electrode 1 and a base electrode 2 are formed so that they are connected to the respective cells. As seen from perspective views of FIGS. 3(a) and 3(b) in which the package is removed. The respective electrodes 1 and 2 are formed to constitute comb teeth which are in mesh with each other.

As the MOS transistor, a vertical MOS transistor and double-diffused MOSFET are known for use in a large current. In both MOSFETs, body regions which serve as cell regions are formed in a matrix shape, source electrodes are formed to be connected to the source regions formed within the respective body regions, and a source electrode pad and a gate electrode pad are formed on a semiconductor chip surface. In the case of the MOSFET, the gate electrodes in the respective cells and a gate wiring which connects these gate electrodes to one another are formed of poly-Si which belong a different layer from the source wiring of a metallic film such as Al. As the case may be, the gate electrodes are connected partially by a metallic wiring serving as a gate finger.

In order to improve the current characteristic of such a semiconductor chip, its area within a package must be maximized. For example, in SC-59 (trade name), the molding part of the package is rectangular so that the planar shape of the semiconductor chip is also rectangular. As seen from FIG. 3(a), the emitter electrode 1 and base electrode 2 are formed so that their teeth extend along the short side of a rectangle. Their electrode pads 1a and 2a are formed centrally in the long side of the rectangle. A semiconductor chip 10 is die-bonded on a rectangular die pad so that a collector electrode 3 formed on the rear surface of the semiconductor chip 10 is electrically connected to a third lead 6. An emitter electrode pad 1a and a first lead 4 are connected by a wire 7 of e.g. gold and an base electrode pad 2a and a second lead 5 are also connected by the wire 7. The periphery of the semiconductor chip is covered with molding resin as indicated in one-dot chain line.

In this structure, since the electrodes at the center on the semiconductor chip and the leads on both ends thereof are connected by wires, respectively, the length L of each wire is increased. Therefore, its resistance will disadvantageously boost the collector-emitter voltage.

On the other hand, as seen from FIG. 3(b), where the electrode pattern on the semiconductor chip 10 is formed so that comb teeth extend along a long side of a rectangle of the semiconductor chip 10, their electrodes 1a and 2a are approximate to the second leads 4 and 5 so that the former can be connected to the latter via a short wire 7. However, this structure lengthens the length L2 of the wiring pattern on the semiconductor chip so that the resistance of the metallic film wiring which is formed of a thin film cannot be disregarded for a large current. Further, in the MOSFET, connection of gate electrodes by a poly-Si film presents a problem that the signal transmission speed to a cell far from the electrode pad is retarded.

As described above, in the transistor for use in a large current in which a large number of cells constituting transistor units in a semiconductor chip are formed and an electrode wiring is formed to be connected to the respective cells, the position of the electrode pads and the resistance of the wire for connecting the electrode pad and the external lead greatly influence the characteristic of the transistor. This presents problem that a large current cannot be acquired at a low operation voltage.

Further, in order to reduce the resistance of the electrode wiring on the semiconductor chip, the wiring is formed in double layers to increase the wiring area. However, forming the double layers presents a problem that the number of the steps for manufacturing the semiconductor chip is increased and the production cost is raised.

SUMMARY OF THE INVENTION

This invention has been accomplished in order to solve the problems described above. An object of this invention is to provide a transistor which can reduce the resistance of an electrode wiring and a connecting portion to an external lead so that a large current can be acquired at a low operation voltage.

The transistor according to this invention comprises a semiconductor chip in which a large number of cells constituting transistor units are arranged on a planar and rectangular semiconductor substrate, on the front surface of the semiconductor chip, a first electrode to be connected to an emitter or source and a second electrode to be connected to an base or gate are formed, and electrode pads of the first electrode and the second electrode are formed on opposite long sides of the rectangular substrate, and on the rear surface of the semiconductor chip, a third electrode to be connected to a collector or drain is formed; a third lead having a rectangular island to which the semiconductor chip is die-bonded and which is extended out from a long side of the island in a direction perpendicular to a long side of the island; a first and a second lead which are directly bonded to the electrode pads of the first and the second electrode; and a resin package covering the periphery of the semiconductor chip. It should be noted that the cells constituting transistor units may be formed in stripes.

In accordance with such a structure, electrode wirings formed on a semiconductor chip are short wirings extending along a short side of a rectangle so that the resistance to the cells on the edge side of the chip is not increased so greatly. Further, the electrode pads which are centrally located on the semiconductor chip are relatively apart form the first lead and the second lead. However, since the first lead and the second lead are directly connected to the electrode pads, the first lead and second lead can be sufficiently thick and give a small resistance, thereby giving rise to no increase in the driving voltage.

The first and the second lead are formed so that they are extended on both ends of the rectangular island in a direction in parallel to the third lead along the semiconductor chip from the side opposite to the the third lead, and their tip sides are bent in an L-shape toward the center of the semiconductor chip and formed in parallel to each other so that they are located at the electrode pads of the first and the second electrode, respectively. In accordance with such a configuration, where the transistors having large or small semiconductor chip sizes according to characteristics are prepared for market as a series of various kinds of products, if the semiconductor chips are manufactured with the length of the short side of the rectangle being constant and the length of the long side being variable, the transistors can be assembled in the same manufacturing process by only replacing the semiconductor chip using the same lead frame.

The transistor preferably has a structure in which the first electrode and the second electrode are an emitter electrode and a base electrode which are an emitter and a base of a bipolar transistor, respectively, and the emitter electrode and the base electrode are made of a metallic film so as to constitute comb teeth which are in mesh with each other.

DESCRIPTION OF THE PREFERRED EMBODIMENTS

Figure 1A:
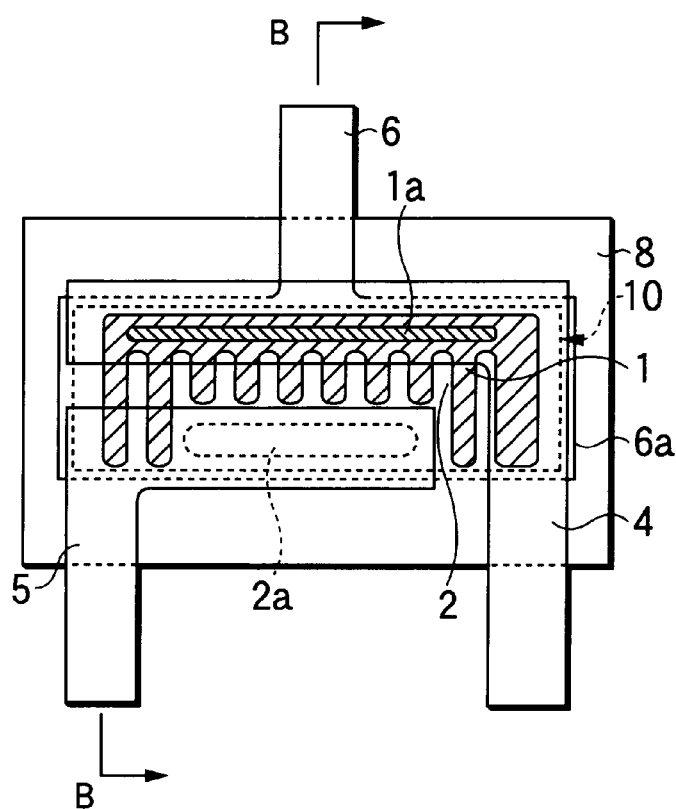
FIGS. 1(a) and 1(b) show the views for explaining an embodiment of a transistor according to this invention.

Now referring to the drawings, an explanation will be given of a transistor according to this invention. FIG. 1 shows a plan with a package removed and a section with the package. As seen from FIG. 1, the transistor according to this invention is structured so that a semiconductor chip 10 is provided to form a large number of cells constituting transistor units arranged on a planar and rectangular semiconductor substrate; on the front surface of the semiconductor chip 10, a first electrode (emitter electrode 1) to be connected to an emitter or source and a second electrode (base electrode 2) to be connected to an base or gate are formed and electrode pads 1a and 2a of the emitter electrode 1 and the base electrode 2 are formed on opposite long sides of the rectangular substrate; and on the rear surface of the semiconductor chip 10, a third electrode (collector electrode 3) to be connected to a collector or drain is formed.

On the side of leads, a rectangular island 6a is formed to which the semiconductor chip 10 is to be die-bonded. A third lead is extended out from the long side of the island 6a in a direction perpendicular thereto. A first lead 4 and a second lead 5 are directly connected to an emitter electrode pad 1a and a base electrode pad 2a, respectively. The periphery of the semiconductor chip 10 is covered with a resin package 8.

Figure 1B:
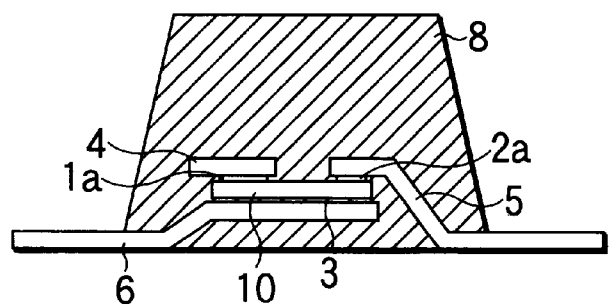
Figure 2:
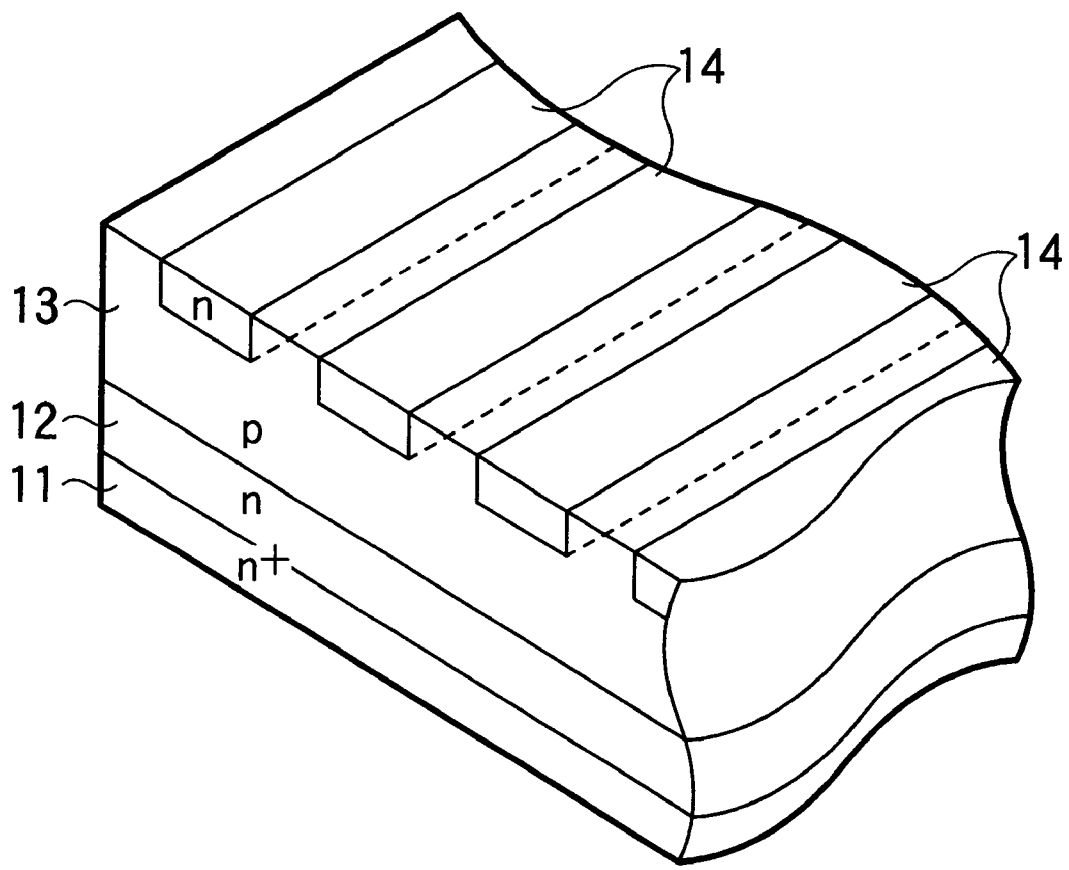
FIG. 2 is a view for explaining an example of the semiconductor structure of the transistor shown in FIG. 1.
Figure 3A:
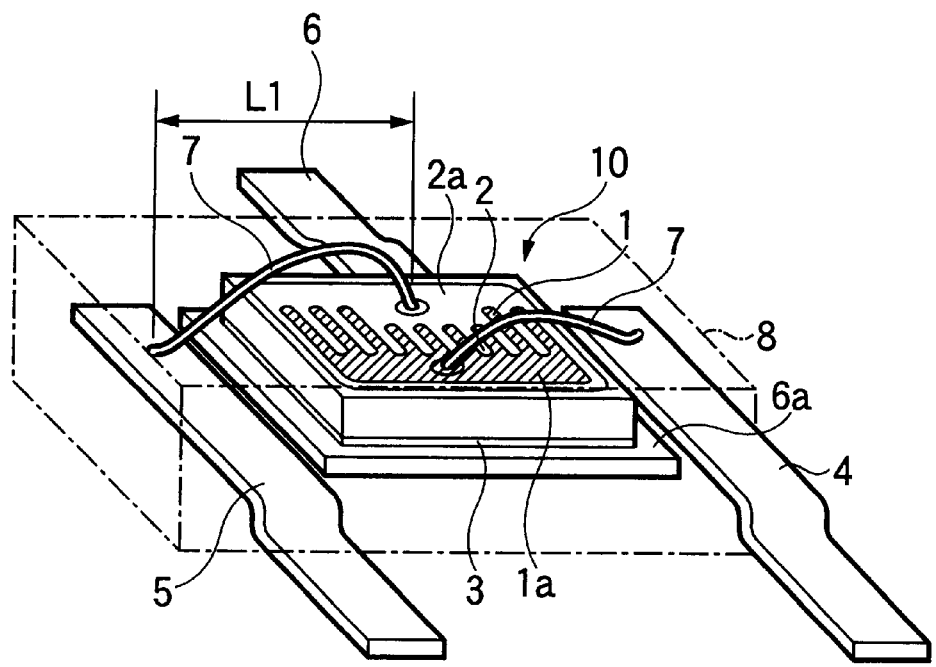
FIGS. 3(a) and 3(b) show the view showing a wiring pattern and its connecting structure to an external lead in a conventional transistor.
Figure 3B:
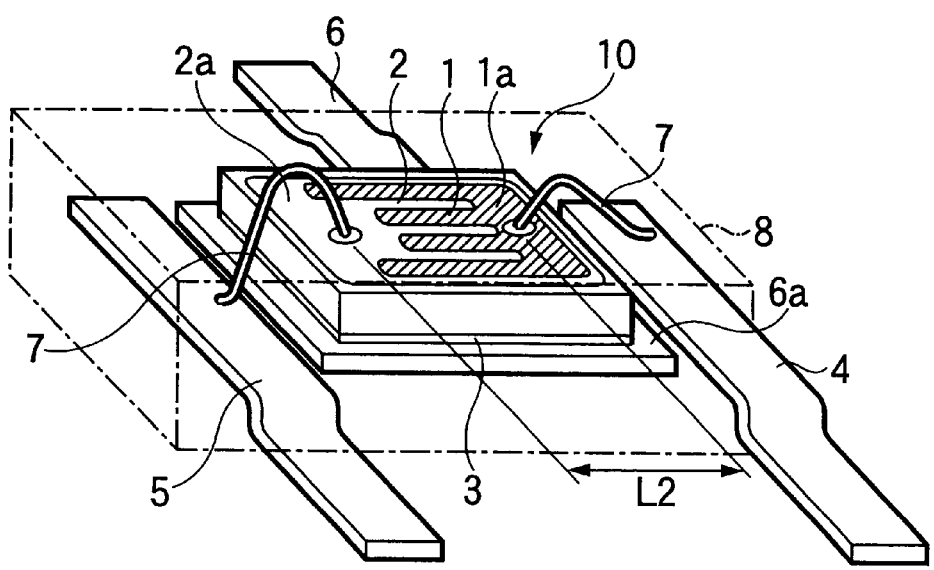

As seen from FIG. 2, the semiconductor chip 10 provides a transistor in a stripe emitter structure in such a manner that p-type impurities such as boron are diffused from the surface of an n-type semiconductor layer 12 formed on an n-type semiconductor substrate 11 to form a p-type base region 13 and n-type emitter regions 14 in stripes are formed at regular intervals in the base region 13. Through contact holes made in the front surface, the emitter electrode 1 and base electrode 2 (FIG. 1) are brought into contact with the emitter regions extending in the stripe direction and base region 13 between the adjacent emitter regions and formed in a comb shape so that their teeth are in mesh with each other. On the entire rear surface of the semiconductor chip 11, a collector electrode 3 is formed. As described above, the semiconductor chip 10 is formed in the planar shape of a rectangle. For example, a bipolar transistor for amplifying with a collector current of about 6 A is formed in a size in length and width of about 0.8 mm×2 mm.

Since the emitter regions 14 in stripes are extended along the short side of the semiconductor substrate which is rectangular in its planar shape and arranged in the direction of the long side thereof, as seen from FIG. 1(a), the emitter electrode 1 and base electrode 2 are arranged in plural columns (teeth) over a short distance, which are coupled with one another on their one end. A emitter electrode pad 1a and a base electrode pas 2a are formed centrally on opposite sides on the long sides of the semiconductor substrate.

The emitter electrode pad 1a and the base electrode pas 2a are formed centrally on opposite sides on the long sides of the semiconductor substrate. This is preferable because the distances from the electrode pad to the cells within the chip does not become unbalance, and hence does not increase the resistance. However, even when the electrode pads are formed on the ends of the long sides, if the portion coupling the electrode stripes is formed widely, the resistance does not increase so greatly. The electrode structure shown in FIG. 2 is the strip emitter structure. However, the electrode structure formed in the comb-shape results in the same structure as described above in the transistor having a multi-emitter structure in which emitter regions are formed in a matrix or having a multi-base structure in which base regions are exposed in a matrix within the emitter regions.

The first lead 4 and second lead 5 are formed in a frame apart from each other by the distance of the long side of the semiconductor chip 10, and their tips are bent in a L-shape to face each other in a direction perpendicular to their extending direction. Specifically, they are bent to extend toward the center from both ends of the semiconductor chip 10, and their bending portions, when assembled with the semiconductor chip 10, are slightly staggered in parallel so as to coincide with the positions of the emitter electrode pad 1a and the base electrode pad 2a, respectively.

At the tip of a third lead 6, a die pad 6a is formed which is used for bonding the semiconductor chip 10. The die pad 6a is formed in a shape on which the semiconductor chip having a maximum area according to a molding package can be mounted. For example, in a package SC-59 (trade name), the die pad 6a is formed in a rectangular shape according to that of the molding portion. The third lead extends from the center of the die pad 6a. In its state formed as a lead frame, at its tip, the third lead is branched into a plurality of segments coupled with a side rail in a frame shape. The third lead 6 and the above first and second leads 4 and 5 can be formed into a single lead frame.

Using conductive paste, the semiconductor chip 10 is bonded onto the die pad 6a of the third lead 6. Thereafter, using the conductive adhesive or via a solder bump formed on the electrode pad, the first lead 4 and the second lead 5 are connected to the emitter electrode 1a and base electrode pad 2a on the semiconductor chip 10, respectively. The semiconductor chip 10 and its bonding portions are molded by epoxy resin to form a package 8. Thus, the transistor according to this invention is completed.

In accordance with the transistor of this invention, in the electrode pattern on the semiconductor chip, its wirings are formed along a short side of the semiconductor chip. Therefore, they are not lengthened so that the resistance to the cells on the edge side of the chip is not increased. Further, the electrode pad which compiles these electrode wirings and the lead to be extended externally are directly connected to each other with no wire therebetween. Therefore, the resistance therebetween is not problematic. Thus, the resistance from the lead externally extended to the cells of the transistor can be reduced greatly. Accordingly, the saturation voltage between the collector and emitter of the bipolar transistor can be reduced so that a large current can be acquired at a low driving voltage.

The first and the second lead are formed in an L-shape in which tip side is bend at a right angle. Therefore, the semiconductor chip which is increased or decreased in size according to an operation current can be connected to anywhere of the tip side bend in the L-shape. Hence, the semiconductor chip can be surely connected to the first and the second electrode pad using a common lead frame.

This invention has been described in connection with the bipolar transistor in which the emitter electrode and the base electrode are formed to constitute comb teeth which are in mesh with each other. However, this invention can also be applied to e.g. an MOSFET in which a source electrode for cells in a matrix is formed over a wide area of the semiconductor chip surface and a gate electrode pad and a source electrode pad are formed on the long side of the semiconductor chip, and a transistor such as IGBT or a junction-type FET. In these cases, since the first and the second lead according to this invention are connected to the source electrode pad and the gate electrode pad, a large current with a small series resistance can be acquired.

In accordance with this invention, since the electrode pattern is formed so that the electrode wirings from the electrode pad on the semiconductor chip to the cells at the edge of the semiconductor chip is shortened and the electrode pad is connected to the lead to be extended externally with no wire, the wiring resistance can be reduced greatly, thereby providing a transistor which can provide a large current at a low operating voltage.

Further, since the lead connected to the surface of the transistor is bent in an L-shape, the same lead frame can be used for a large or small chip of the semiconductor chip having a variable length, thereby promoting compatibility of the lead frame.

What is claimed is:

1. A semiconductor device comprising:
   a semiconductor chip which is comprised of:
      a plurality of transistor cells arranged on a rectangular substrate;
      a first electrode electrically connected to first type semiconductor regions of said plurality of transistor cells, on which a first electrode pad is formed;
      a second electrode electrically connected to second type semiconductor regions of said plurality of transistor cells, on which a second electrode pad is formed, and
      a third electrode electrically connected to third type semiconductor regions of said plurality of transistor cells, said third electrode being formed on a back surface of the rectangular substrate;
   a first lead connected to said first electrode pad;
   a second lead connected to said second electrode pad, and
   a third lead which has a rectangular island to die-bond said semiconductor chip and is extended out from a long side of said island in a perpendicular direction thereof,
   wherein said first electrode pad and said second electrode pad are formed on a side where a plurality of transistor cells are arranged, each of said first and second electrode pads being arranged at a different long side of the semiconductor chip opposed each other,
   further wherein said first and second leads are directly bonded onto said first and second electrode pads respectively.

2. A semiconductor device according to claim 1, wherein said first and said second leads are extended in a parallel and opposite direction of an extending direction of said third lead in which tip sides thereof to be bonded are bent in an L-shape toward a central position of said semiconductor chip with being parallel to each other so as to be located at said first and second electrode pads respectively.

3. A semiconductor device according to claim 2, wherein said first electrode and said second electrode are made of a metallic film so as to constitute comb-teeth shapes which are interlocked with each other.

4. A semiconductor device according to any one of claims 1 to 3, wherein said first, second and third type semiconductor regions are corresponding to an emitter, a base and a collector regions of a bipolar transistor.

5. A semiconductor device according to any one of claims 1 to 3, wherein said first, second and third type semiconductor regions are corresponding to a source, a gate and a drain regions of a metal oxide type semiconductor.

6. A semiconductor device according to claim 1, wherein said first electrode and said second electrode are made of a metallic film so as to constitute comb-teeth shapes which are interlocked with each other.

7. A semiconductor device according to claim 6, wherein said first, second and third type semiconductor regions are corresponding to an emitter, a base and a collector regions of a bipolar transistor.

8. A semiconductor device according to claim 6, wherein said first, second and third type semiconductor regions are corresponding to a source, a gate and a drain regions of a metal oxide type semiconductor.

* * * * *